(12) United States Patent
Yun et al.

(10) Patent No.: US 7,821,310 B2
(45) Date of Patent: Oct. 26, 2010

(54) DLL CIRCUIT HAVING DUTY CYCLE CORRECTION AND METHOD OF CONTROLLING THE SAME

(75) Inventors: Won Joo Yun, Gyeonggi-do (KR); Hyun Woo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/345,136

(22) Filed: Dec. 29, 2008

(65) Prior Publication Data

US 2010/0109725 A1 May 6, 2010

(30) Foreign Application Priority Data

Oct. 31, 2008 (KR) .................. 10-2008-0107694

(51) Int. Cl.
  *H03L 7/06* (2006.01)
(52) U.S. Cl. .................. 327/158; 327/149; 327/156
(58) Field of Classification Search .......... 327/149, 327/156, 158
  See application file for complete search history.

(56) References Cited

U.S. PATENT DOCUMENTS

| | | | |
|---|---|---|---|
| 6,765,976 B1 | 7/2004 | Oh | |
| 6,967,514 B2 * | 11/2005 | Kizer et al. ............. | 327/175 |
| 7,184,509 B2 | 2/2007 | Cho et al. | |
| 7,521,974 B2 * | 4/2009 | Kirschenmann ......... | 327/156 |
| 7,598,783 B2 * | 10/2009 | Shin et al. ............... | 327/158 |
| 7,633,324 B2 * | 12/2009 | Yun et al. ............... | 327/160 |
| 2007/0279109 A1 * | 12/2007 | Kirschenmann ......... | 327/156 |
| 2008/0100356 A1 | 5/2008 | Lee | |
| 2008/0191767 A1 * | 8/2008 | Koo ....................... | 327/175 |
| 2008/0278206 A1 * | 11/2008 | Kim et al. ............... | 327/158 |
| 2009/0295446 A1 * | 12/2009 | Yun et al. ............... | 327/175 |

FOREIGN PATENT DOCUMENTS

| KR | 1020070016737 A | 2/2007 |
|---|---|---|
| KR | 1020080069756 A | 7/2008 |

* cited by examiner

*Primary Examiner*—Lincoln Donovan
*Assistant Examiner*—Adam D Houston
(74) *Attorney, Agent, or Firm*—Ladas & Parry LLP

(57) ABSTRACT

A delay locked loop (DLL) circuit includes a duty cycle correcting unit configured to correct a duty cycle of a reference clock signal in response to a duty cycle correction signal and generate a correction clock signal. A feedback loop of the DLL circuit performs a delay lock operation on the correction clock signal and generates an output clock signal. A first duty cycle detecting unit detects a duty cycle of the correction clock signal and generates a first detection signal and a second duty cycle detecting unit detects a duty cycle of the output clock signal and generates a second detection signal. Finally, a duty cycle control unit generates the duty cycle correction signal in response to the first detection signal and the second detection signal to perform the duty cycle correction.

30 Claims, 6 Drawing Sheets

US 7,821,310 B2

DLL CIRCUIT HAVING DUTY CYCLE CORRECTION AND METHOD OF CONTROLLING THE SAME

CROSS-REFERENCES TO RELATED APPLICATION

The present application claims priority under 35 U.S.C 119(a) to Korean Application No. 102008-0107694, filed on Oct. 31, 2008, in the Korean Intellectual Property Office, which is incorporated herein by reference in its entirety as if set forth in full.

BACKGROUND

1. Technical Field

The embodiment described herein relates generally to a semiconductor integrated circuit (IC), and more particularly, to a delay locked loop (DLL) circuit that is included in a semiconductor IC and a method of controlling the DLL circuit.

2. Related Art

Conventional semiconductor ICs, such as synchronous dynamic random access memories (SDRAMs), are operated using a clock signal while improving an operational speed. The semiconductor IC includes a clock buffer to buffer an externally inputted clock signal and uses the buffered clock signal outputted from the clock buffer. In some cases, the semiconductor IC generates and uses an internal clock signal. In this case, a phase difference between the internal clock signal an external clock signal is corrected using a delay locked loop (DLL) circuit or a phase locked loop (PLL) circuit. For an internal clock signal that is used in the semiconductor IC, a ratio between a high interval and a low interval, i.e., a duty ratio, is preferably maintained at 50:50. However, the duty ratio of the internal clock signal may become distorted since the semiconductor IC includes a plurality of delay elements.

A clock signal having a stable duty ratio is required since availability of a clock signal increases as the operational speed of the semiconductor IC increases. Accordingly, a DLL circuit of each semiconductor IC includes a duty cycle correction apparatus to stabilize the duty ratio of a clock signal. Duty cycle correction technology has become increasingly important in order to stably use a clock signal during high-speed operation.

The conventional duty cycle correction apparatus included in a DLL circuit is disposed near a clock output terminal of the DLL circuit and detects a duty ratio of an output clock signal and corrects the duty ratio. When a clock signal having a distorted waveform due to noise is input to the DLL circuit, the clock signal can be removed while passing though a delay line of the DLL circuit, which may have a negative result. However, conventional duty cycle correction technology cannot be utilized where the input clock signal is distorted. Accordingly, the conventional duty cycle correction operation of the DLL circuit has technical limitations. As a result, it is difficult to stably support the operation of the semiconductor IC.

SUMMARY

A DLL circuit and a method of controlling the DLL circuit that can stably generate an internal clock signal are disclosed herein.

A DLL circuit and a method of controlling the DLL circuit that can generate an internal clock signal having a corrected duty cycle are disclosed herein.

According to one embodiment of the present invention, a delay locked loop (DLL) circuit comprises a duty cycle correcting unit configured to correct a duty cycle of a reference clock signal in response to a duty cycle correction signal and generate a correction clock signal, a feedback loop configured to perform a delay lock operation on the correction clock signal and generate an output clock signal, a first duty cycle detecting unit configured to detect a duty cycle of the correction clock signal and generate a first detection signal, a second duty cycle detecting unit configured to detect a duty cycle of the output clock signal and generate a second detection signal, and a duty cycle control unit configured to generate the duty cycle correction signal in response to the first detection signal and the second detection signal.

According to another embodiment of the present invention, a delay locked loop (DLL) circuit comprises a duty cycle correcting unit configured to correct a duty cycle of a reference clock signal in response to a duty cycle correction signal and generate a correction clock signal, a duty cycle control unit configured to primarily adjust a logical value of the duty cycle correction signal before a delay lock operation is completed and secondarily adjust the logical value of the duty cycle correction signal after the delay lock operation is completed, and a delay line configured to delay the correction clock signal.

According to still another embodiment of the present invention, a method of controlling a delay locked loop (DLL) circuit comprises performing a primary duty cycle correction operation on a reference clock signal to generate a correction clock signal, performing a delay lock operation on the correction clock signal to generate an output clock signal, and performing a secondary duty cycle correction operation on the output clock signal after the delay lock operation is completed.

These and other features of the embodiments of the present invention are described below in the section "Detailed Description."

BRIEF DESCRIPTION OF THE DRAWINGS

Features and embodiments of the present invention are described in conjunction with the attached drawings, in which.

DETAILED DESCRIPTION

Figure 1:
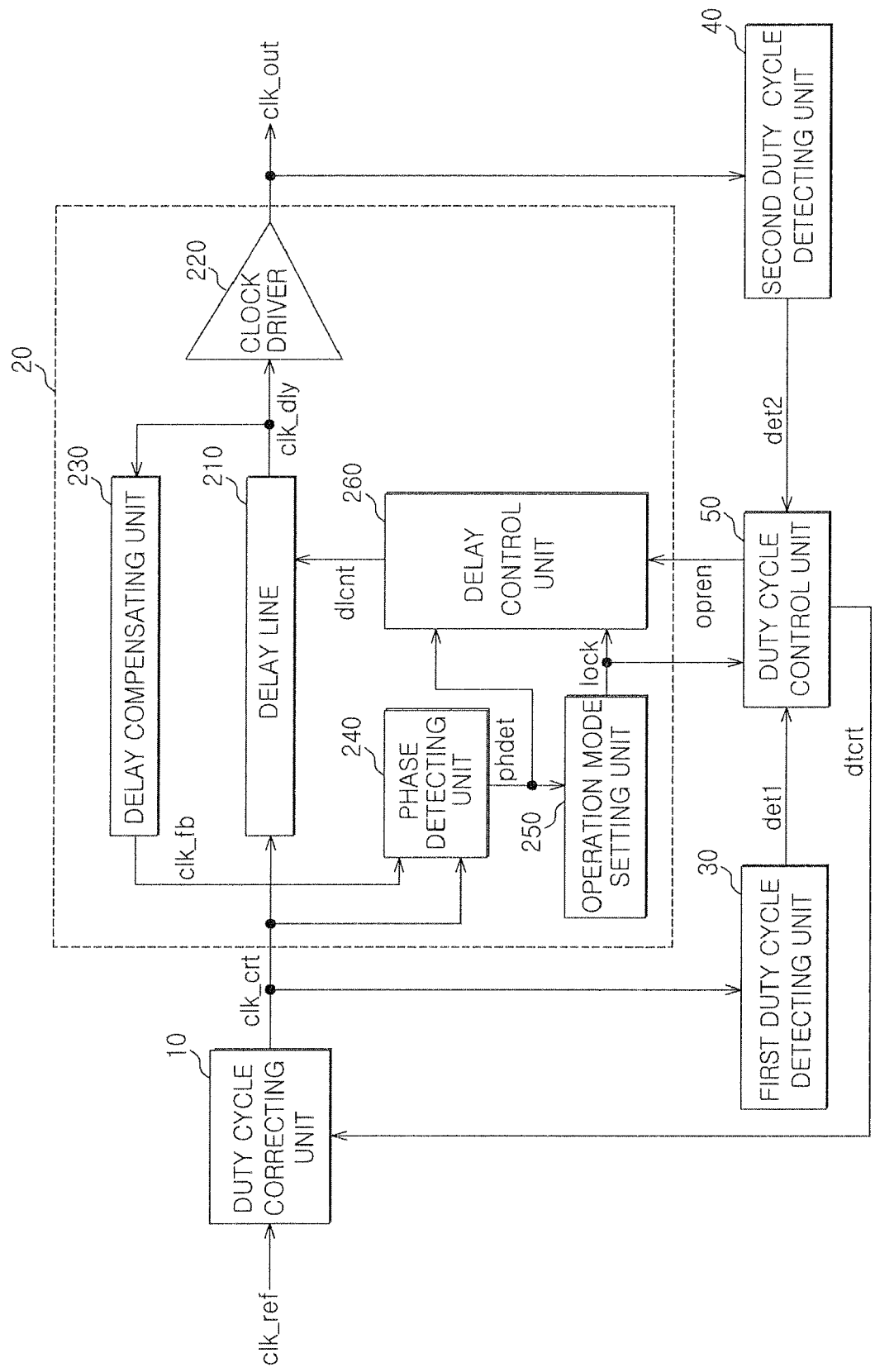
FIG. 1 is a block diagram showing an exemplary DLL circuit according to one embodiment of the present invention.

FIG. 1 is a block diagram showing an exemplary DLL circuit according to one embodiment of the present invention.

As shown in FIG. 1, a DLL circuit according to one embodiment of the present invention can be configured to include a duty cycle correcting unit 10, a feedback loop 20, a first duty cycle detecting unit 30, a second duty cycle detecting unit 40, and a duty cycle control unit 50.

The duty cycle correcting unit 10 can correct a duty cycle of a reference clock signal 'clk_ref' in response to a duty cycle correction signal 'dtcrt' from the duty cycle control unit 50 and generate a correction clock signal 'clk_crt'. The feedback loop 20 can perform a delay lock operation on the correction clock signal 'clk_crt' in response to an operation enable signal 'opren' from the duty cycle control unit 50 and generate a lock completion signal 'lock' and an output clock signal 'clk_out'.

The first duty cycle detecting unit 30 can detect a duty cycle of the correction clock signal 'clk_crt' and generate a first detection signal 'det1'. The second duty cycle detecting unit 40 can detect a duty cycle of the output clock signal 'clk_out' and generate a second detection signal 'det2'.

The duty cycle control unit 50 can generate the operation enable signal 'opren' and the duty cycle correction signal 'dtcrt' in response to the lock completion signal 'lock', the first detection signal 'det1', and the second detection signal 'det2'.

As described, each of the reference clock signal 'clk_ref' and the output clock signal 'clk_out' are described as a clock signal having a single phase, but can also be implemented in the form of a clock signal pair. It is easily understood by those having ordinary skill in the art that the reference clock signal 'clk_ref' and the output clock signal 'clk_out' having a single phase may be implemented as a clock signal pair to alter the corresponding structure. Meanwhile, the reference clock signal 'clk_ref' can be generated by buffering an external clock signal using a clock input buffer.

The feedback loop 20 can include a delay line 210, a clock driver 220, a delay compensating unit 230, a phase detecting unit 240, an operation mode setting unit 250, and a delay control unit 260.

The delay line 210 can delay the correction clock signal 'clk_crt' in response to a delay control signal 'dlcnt' from the delay control unit 260 and generate a delay clock signal 'clk_dly'. The clock driver 220 can drive the delay clock signal 'clk_dly' and generate the output clock signal 'clk_out'. The delay compensating unit 230 can apply a delay time, which is obtained by simulating a delay amount of an output path for the delay clock signal 'clk_dly', to the delay clock signal 'clk_dly' and generate a feedback clock signal 'clk_fb'.

The phase detecting unit 240 can compare phases of the correction clock signal 'clk_crt' and the feedback clock signal 'clk_fb' and generate a phase detection signal 'phdet'. The operation mode setting unit 250 can determine whether a delay lock operation is completed according to the phase detection signal 'phdet' and generate the lock completion signal 'lock'. The delay control unit 260 can generate the delay control signal 'dlcnt' in response to the operation enable signal 'opren', the phase detection signal 'phdet', and the lock completion signal 'lock'.

In the DLL circuit having the above-described structure, the duty cycle correction signal 'dtcrt' can be implemented as a digital code having a plurality of bits. The duty cycle correcting unit 10 can change the correction amount of the duty cycle for the reference clock signal 'clk_ref' according to a logical value of the duty cycle correction signal 'dtcrt'.

The first duty cycle detecting unit 30 can be implemented as a combination of a duty accumulator and a differential amplifier, which is commonly understood by those skilled in the art. The first duty cycle detecting unit 30 enables or disables the first detection signal 'det1' according to a duty state of the correction clock signal 'clk_crt'. For example, when a first interval (in this case, high interval) of the correction clock signal 'clk_crt' is wider than a second interval (in this case, low interval), the first duty cycle detecting unit 30 enables the first detection signal 'det1'. In contrast, when the first interval is narrower than the second interval, the first duty cycle detecting unit 30 disables the first detection signal 'det1'.

Similarly to the first duty cycle detecting unit 30, the second duty cycle detecting unit 40 can be implemented as a combination of a duty accumulator and a differential amplifier. The second duty cycle detecting unit 40 enables or disables the second detection signal 'det2' according to a duty state of the output clock signal 'clk_out'.

At initial operation of the DLL circuit, the duty cycle correcting unit 10 can change a duty cycle of the correction clock signal 'clk_crt' in a relatively large unit amount. That is, the duty cycle correcting unit 10 can perform a coarse correction operation. The duty cycle control unit 50 can change a logical value of the duty cycle correction signal 'dtcrt' and control the coarse correction operation of the duty cycle correcting unit 10. When the state of the first detection signal 'det1' changes, the duty cycle control unit 50 can detect the change and lock a logical value of the duty cycle correction signal 'dtcrt'. That is, the duty cycle control unit 50 can complete the coarse correction operation. This is because the change in the state of the first detection signal 'det1' means that the duty cycle correcting unit 10 performs a predetermined operation to correct the duty cycle of the correction clock signal 'clk_crt' by a predetermined amount.

At this time, the duty cycle control unit 50 enables the operation enable signal 'opren' immediately after the coarse correction operation is completed. Therefore, the delay control unit 260 of the feedback loop 20 can control the delay amount applied to the correction clock signal 'clk_crt' using the delay line 210 while changing a logical value of the delay control signal 'dlcnt' in response to the phase detection signal 'phdet'. The operation mode setting unit 250 can receive the phase detection signal 'phdet' and determine whether the delay locked operation is completed. When it is determined that the delay locked operation is completed, the operation mode setting unit 250 enables the lock completion signal 'lock'. Accordingly, the delay control unit 260 can lock a logical value of the delay control signal 'dlcnt' to lock the delay amount applied to the correction clock signal 'clk_crt' by the delay line 210.

When the lock completion signal 'lock' is enabled, the duty cycle control unit 50 can again change the logical value of the duty cycle correction signal 'dtcrt' and control the operation of the duty cycle correcting unit 10. At this time, the duty cycle correcting unit 10 can change the duty cycle of the correction clock signal 'clk_crt' in a relatively small unit amount. That is, the duty cycle correcting unit 10 can perform a fine correction operation. When the state of the second detection signal 'det2' changes, the duty cycle control unit 50 can detect the change and lock the logical value of the duty cycle correction signal 'dtcrt' again. That is, the duty cycle control unit 50 can complete the fine correction operation. This is because the change in the state of the second detection signal 'det2' means that the duty cycle correcting unit 10 performs a predetermined operation to correct the duty cycle of the correction clock signal 'clk_crt' by a predetermined amount.

In the DLL circuit having the above-described structure and performing the above-described operation, the removal of reference clock signal 'clk_ref' from the delay line can be prevented even though the reference clock signal 'clk_ref' is input having a distorted waveform, i.e., an erroneous operation can be prevented. That is, the duty cycle detecting units can be disposed at input and output terminals of the delay line 210, respectively, and a duty cycle correction operation can be performed on a clock signal at the input terminal in advance. For example, as shown in FIG. 1, the duty cycle detecting units are disposed at the input and output of the feedback loop 20. As a result, an erroneous operation can be prevented from occurring in advance and the output clock signal 'clk_out' can be stably generated.

When the duty cycle correction operation is performed on the reference clock signal 'clk_ref', the coarse correction operation can be performed first and the fine correction operation can be performed second, such that the output clock signal 'clk_out' has a corrected duty cycle.

Figure 2:
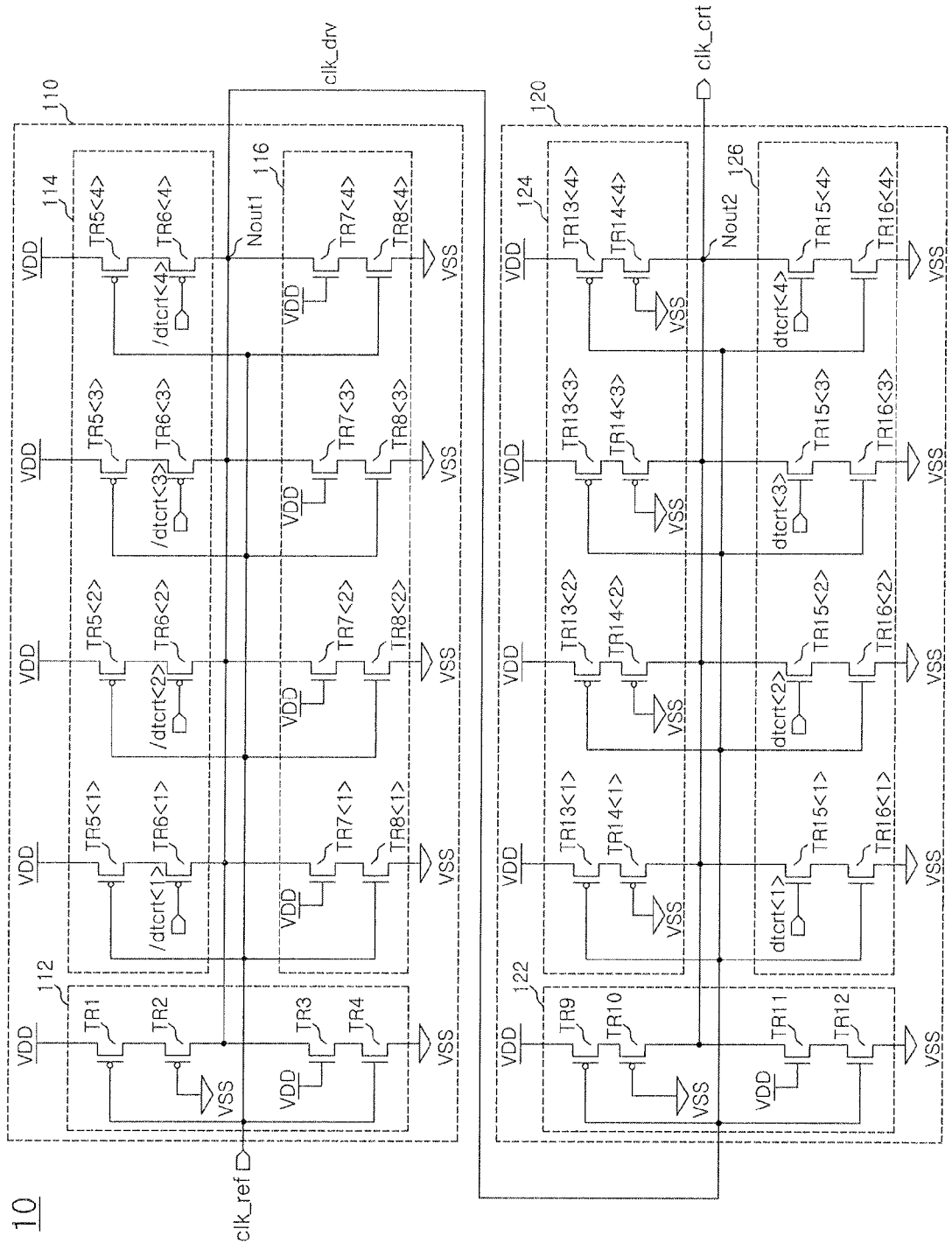
FIG. 2 is a detailed structural diagram showing an exemplary duty cycle correcting unit that can be included with the circuit of FIG. 1 according to one embodiment of the present invention.

FIG. 2 is a detailed structural diagram showing an exemplary duty cycle correcting unit that can be included with the circuit of FIG. 1 according to one embodiment of the present invention. FIG. 2 shows an example of when the duty cycle correction signal is implemented as four bits of a digital code 'dtcrt<1:4>'.

As shown in FIG. 2, the duty cycle correcting unit 10 can include a first driver 110 and a second driver 220.

The first driver 110 can drive the reference clock signal 'clk_ref' in response to an inverted duty cycle correction signal '/dtcrt<1:4>' and output a driving clock signal 'clk_drv'. The first driver 110 can include a first output node Nout1, a first default driver 112, a first pull-up section 114, and a first full-down section 116.

The first output node 'Nout1' can output the driving clock signal 'clk_drv'.

The first default driver 112 can drive the reference clock signal 'clk_ref' and transmit the driven clock signal to the first output node 'Nout1'. The first default driver 112 can include a first transistor TR1, a second transistor TR2, a third transistor TR3, and a fourth transistor TR4.

The first transistor TR1 can include a gate terminal receiving the reference clock signal 'clk_ref' and a source terminal connected to an external voltage VDD. The second transistor TR2 can include a gate terminal connected to a ground voltage VSS, a source terminal coupled to a drain terminal of the first transistor TR1, and a drain terminal coupled to the first output node Nout1. The third transistor TR3 includes a gate terminal connected to the external voltage VDD and a drain terminal coupled to the first output node Nout1. The fourth transistor TR4 can include a gate terminal receiving the reference clock signal 'clk_ref', a drain terminal coupled to a source terminal of the third transistor TR3, and a source terminal connected to the ground voltage VSS.

The first pull-up section 114 can drive a voltage of the first output node Nout1 using a pull-up method in response to the reference clock signal 'clk_ref' and the inverted duty cycle correction signal '/dtcrt<1:4>'. The first pull-up section 114 can include four fifth transistors TR5<1:4> and four sixth transistors TR6<1:4>.

Each of the four fifth transistors TR5<1:4> can include a gate terminal receiving the reference clock signal 'clk_ref' and a source terminal connected to the external voltage VDD. Each of the four sixth transistors TR6<1:4> can include a gate terminal receiving one bit of the inverted duty cycle correction signal '/dtcrt<1:4>, a source terminal coupled to a drain terminal of each of the four fifth transistors TR5<1:4>, and a drain terminal coupled to the first output node Nout1.

The first pull-down section 116 can drive a voltage of the first output node Nout1 using a pull-down method in response to the external voltage VDD and the reference clock signal 'clk_ref'. The first pull-down section 116 can include four seventh transistors TR7<1:4> and four eighth transistors TR8<1:4>.

Each of the four seventh transistors TR7<1:4> can include a gate terminal connected to the external voltage VDD and a drain terminal coupled to the first output node Nout1. Each of the four eighth transistors TR8<1:4> can include a gate terminal receiving the reference clock signal 'clk_ref', a drain terminal coupled to a source terminal of each of the four seventh transistors TR7<1:4>, and a source terminal connected to the ground voltage VSS.

The second driver 120 can drive the driving clock signal 'clk_drv' in response to the duty cycle correction signal 'dtcrt<1:4>' and generate the correction clock signal 'clk_crt'. The second driver 120 can include a second output node Nout2, a second default driver 122, a second pull-up section 124, and a second pull-down section 126.

The second output node Nout2 can output the correction clock signal 'clk_crt.

The second default driver 122 can drive the driving clock signal 'clk_dry' and transmit the driven clock signal to the second output node Nout2. The second default driver 122 can include a ninth transistor TR9, a tenth transistor TR10, an eleventh transistor TR11, and a twelfth transistor TR12.

The ninth transistor TR9 can include a gate terminal receiving the driving clock signal clk_dry and a source terminal connected to the external voltage VDD. The tenth transistor TR10 can include a gate terminal connected to the ground voltage VSS, a source terminal coupled to a drain terminal of the ninth transistor TR9, and a drain terminal coupled to the second output node Nout2. The eleventh transistor TR11 can include a gate terminal connected to the external voltage VDD and a drain terminal coupled to the second output node Nout2. The twelfth transistor TR12 can include a gate terminal receiving the driving clock signal 'clk_drv', a drain terminal coupled to a source terminal of the eleventh transistor TR11, and a source terminal connected to the ground voltage VSS.

The second pull-up section 124 can drive a voltage of the second output node Nout2 using a pull-up method in response to the driving clock signal 'clk_drv' and the ground voltage VSS. The second pull-up section 124 can include four thirteenth transistors TR13<1:4> and four fourteenth transistors TR14<1:4>.

Each of the four thirteenth transistors TR13<1:4> can include a gate terminal receiving the driving clock signal 'clk_drv' and a source terminal connected to the external voltage VDD. Each of the four fourteenth transistors TR14<1:4> can include a gate terminal connected to the ground voltage VSS, a source terminal coupled to a drain terminal of each of the four thirteenth transistors TR13<1:4>, and a drain terminal coupled to the second output node Nout2.

The second pull-down section 126 can drive a voltage of the second output node Nout2 using a pull-down method in response to the duty cycle correction signal 'dtcrt<1:4>' and the driving clock signal 'clk_drv'. The second pull-down section 126 can include four fifteenth transistors TR15<1:4> and four sixteenth transistors TR16<1:4>.

Each of the four fifteenth transistors TR15<1:4> can include a gate terminal that receives one bit of the duty cycle correction signal 'dtcrt<1:4>' and a drain terminal coupled to the second output node Nout2. Each of the four sixteenth transistors TR16<1:4> can include a gate terminal receiving the driving clock signal 'clk_drv' a drain terminal coupled to a source terminal of each of the four fifteenth transistors TR15<1:4>, and a source terminal that is connected to a ground voltage VSS.

The inverted duty cycle correction signal '/dtcrt<1:4>' can be generated by inverting the duty cycle correction signal 'dtcrt<1:4>' using inverters (not shown). When the first bit 'dtcrt<1>' of the duty cycle correction signals 'dtcrt<1:4>' is the most significant bit and the fourth bit 'dtcrt<4>' thereof is the least significant bit, the four sixth transistors TR6<1:4> of the first pull-up section 114 of the first driver 110 can be structured to have sizes according to a ratio of 8:4:2:1. Similarly, the four fifteenth transistors TR15<1:4> of the second pull-down section 126 of the second driver 120 can be structured to have sizes according to a ratio of 8:4:2:1. It is generally well-known in the art that a size of a MOS transistor and a threshold voltage are inversely proportional to each other.

Accordingly, if the logical value of the duty cycle correction signal 'dtcrt<1:4>' sequentially increases or decreases, the driving abilities of the first pull-up section 114 and the second pull-down section 126 can change linearly in response to an increase or decrease in the logical value of the duty cycle correction signal 'dtcrt<1:4>'. That is, if the logical value of the duty cycle correction signal 'dtcrt<1:4>' increases, a high interval of the correction clock signal 'clk_crt' is narrowed and a low interval thereof is widened. In contrast, if the logical value of the duty cycle correction signal 'dtcrt<1:4>' decreases, the high interval of the correction clock signal 'clk_crt' is widened and the low interval thereof is narrowed.

Figure 3:
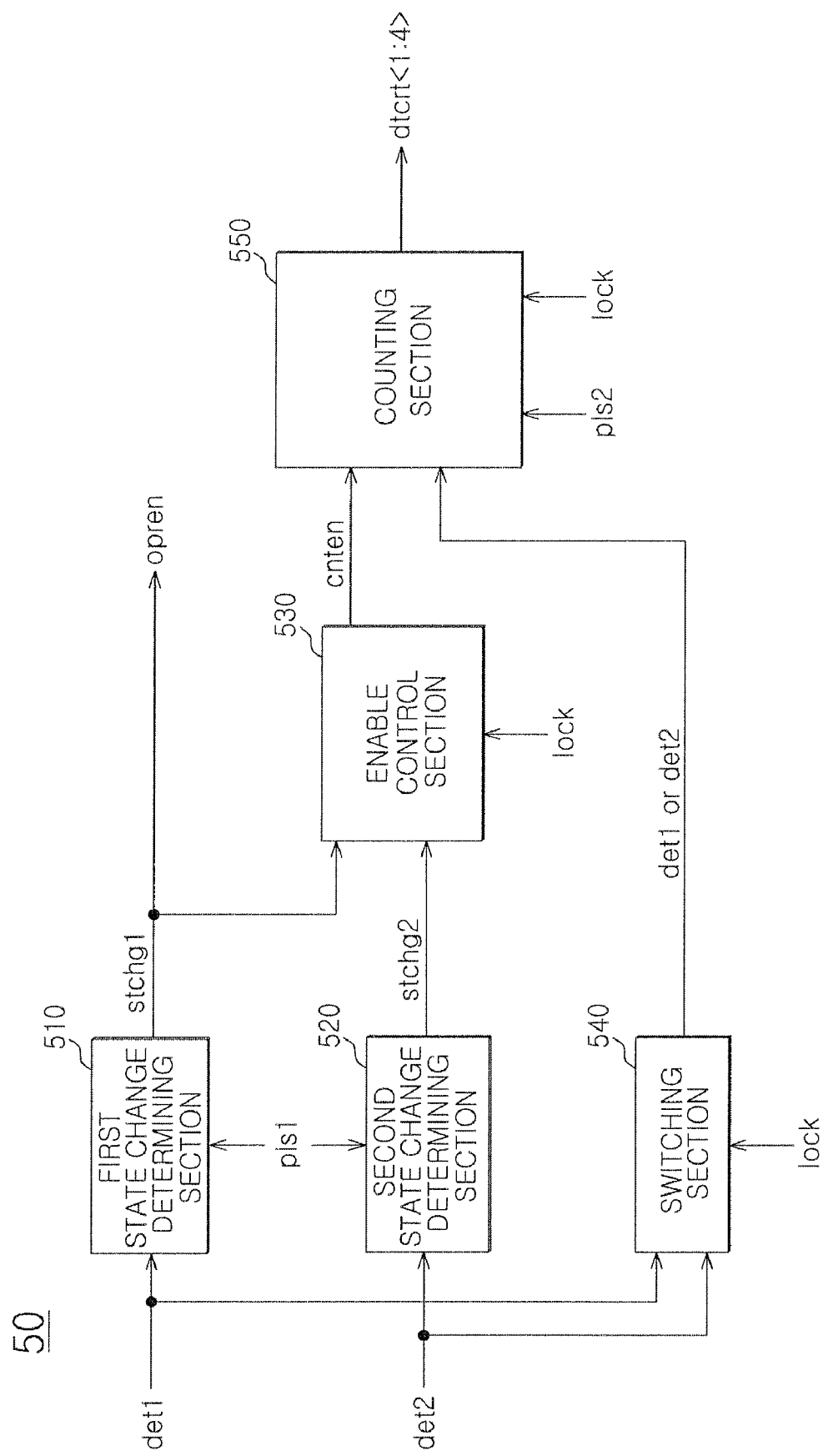
FIG. 3 is a detailed structural diagram showing an exemplary duty cycle control unit that can be included with the circuit of FIG. 1 according to one embodiment of the present invention.

FIG. 3 is a detailed structural diagram showing an exemplary duty cycle control unit 50 that can be included with the circuit of FIG. 1 according to one embodiment of the present invention. In this case, the duty cycle correction signal is exemplified as four bits of a digital code 'dtcrt<1:4>'.

As shown in FIG. 3, the duty cycle control unit 50 can include a first state change determining section 510, a second state change determining section 520, an enable control section 530, a switching section 540, and a counting section 550.

The first state change determining section 510 can determine whether the state of the first detection signal 'det1' changes in response to a first pulse signal 'pls1' and generate a first state change signal 'stchg1' in response. The second state change determining section 520 can determine whether the state of the second detection signal 'det2' changes in response to the first pulse signal 'pls1' and generate a second state change signal 'stchg2' in response. The enable control section 530 can combine the first state change signal 'stchg1', the second state change signal 'stchg2', and the lock completion signal 'lock' of the operation mode setting unit 250 and generate a counting enable signal 'cnten'. The switching section 540 can selectively pass the first detection signal 'det1' or the second detection signal 'det2' in response to the lock completion signal 'lock' of the operation mode setting unit 250. The counting section 550 can perform a counting operation and generate the duty cycle correction signals 'dtcrt<1: 4>' in response to the second pulse signal 'pls2', the lock completion signal 'lock', and the first detection signal 'det1' or the second detection signal 'det2' transmitted from the switching section 540, according to whether the counting enable signal 'cnten' of the enable control section 530 is enabled.

The first pulse signal 'pls1' and the second pulse signal 'pls2' can be generated by a clock generator (not shown) that is included in the DLL circuit. The clock generator can generate a plurality of pulse signals, each of which toggles once per predetermined periods (for example, 16 periods) of the reference clock signal 'clk_ref'. In this case, the first pulse signal 'pls1' can have an enable timing that is faster than enable timing of the second pulse signal 'pls2'.

The first state change determining section 510 can determine whether the state of the first detection signal 'det1' changes, i.e., whether the first detection signal 'det1' changes from an enable state or a disable state. When the state change is detected, the first state change determining section 510 enables the first state change signal 'stchg1'. At this time, the first state change signal 'stchg1' can be transmitted to the delay control unit 260 of the feedback loop 20 as the operation enable signal 'opren'. If the first state change signal 'stchg1' is enabled, the delay control unit 260 can be activated and a delay lock operation of the feedback loop 20 can start.

Similar to the first state change determining section 510, the second state change determining section 520 can determine whether the state of the second detection signal 'det2' changes. When the state change is detected, the second state change determining section 520 enables the second state change signal 'stchg2'.

In the case where the lock completion signal 'lock' of the operation mode setting unit 250 is disabled, the enable control section 530 enables the counting enable signal 'cnten' when the first state change signal 'stchg1' is disabled. In this case, when the second state change signal 'stchg2' is enabled, the enable control section 530 disables the counting enable signal 'cnten'. If the lock completion signal 'lock' of the operation mode setting unit 250 is enabled, the enable control section 530 can determine whether the counting enable signal 'cnten' is enabled according to the state of the second state change signal 'stchg2'. That is, the enable control section 530 enables the counting enable signal 'cnten' when the second state change signal 'stchg2' is disabled, and disables the counting enable signal 'cnten' when the second state change signal 'stchg2' is enabled. More specifically, the enable control section 530 can enable the counting enable signal 'cnten' during a coarse correction operation interval until the state of the first detection signal 'det1' changes and a fine correction operation interval until the state of the second detection signal 'det2' changes from when the lock completion signal 'lock' is enabled.

The switching section 540 can pass the first detection signal 'det1' when the lock completion signal 'lock' is disabled and pass the second detection signal 'det2' when the lock completion signal 'lock' is enabled. The switching section 540 can transmit the first detection signal 'det1' or the second detection signal 'det2' to the counting section 550.

The counting section 550 can be activated only when the counting enable signal 'cnten' is enabled. The counting section 550 can perform a counting operation in response to the first detection signal 'det1' or the second detection signal 'det2' that is transmitted from the switching section 540. The counting section 550 can perform an up-counting operation to increase the logical value of the duty cycle correction signal 'dtcrt<1:4>' where the first detection signal 'det1' or the second detection signal 'det2' is enabled. The counting section 550 can perform a down-counting operation to decrease the logical value of the duty cycle correction signal 'dtcrt<1: 4>' where the first detection signal 'det1' or the second detection signal 'det2' is disabled.

It should be noted that the counting section 550 performs a counting operation on only the two upper bits of the duty cycle correction signal 'dtcrt<1:4>' when the lock completion signal 'lock' is disabled. This is to perform a coarse correction operation by the counting section 550 when the lock completion signal 'lock' is disabled. As a result, a duty cycle of the correction clock signal 'clk_crt' can change in a relatively large unit amount since only transistors having large sizes are controlled in the duty cycle correcting unit 10.

When the lock completion signal 'lock' is enabled, the counting operation is performed on all the bits of the duty cycle correction signal 'dtcrt<1:4>'. At this time, the counting operation may be performed mainly on the two lower bits of the duty cycle correction signal 'dtcrt<1:4>' since the coarse correction operation has already been completed. Accordingly, the duty cycle correcting unit 10 can change the duty cycle of the correction clock signal 'clk_crt' in a relatively small unit amount.

Figure 4:
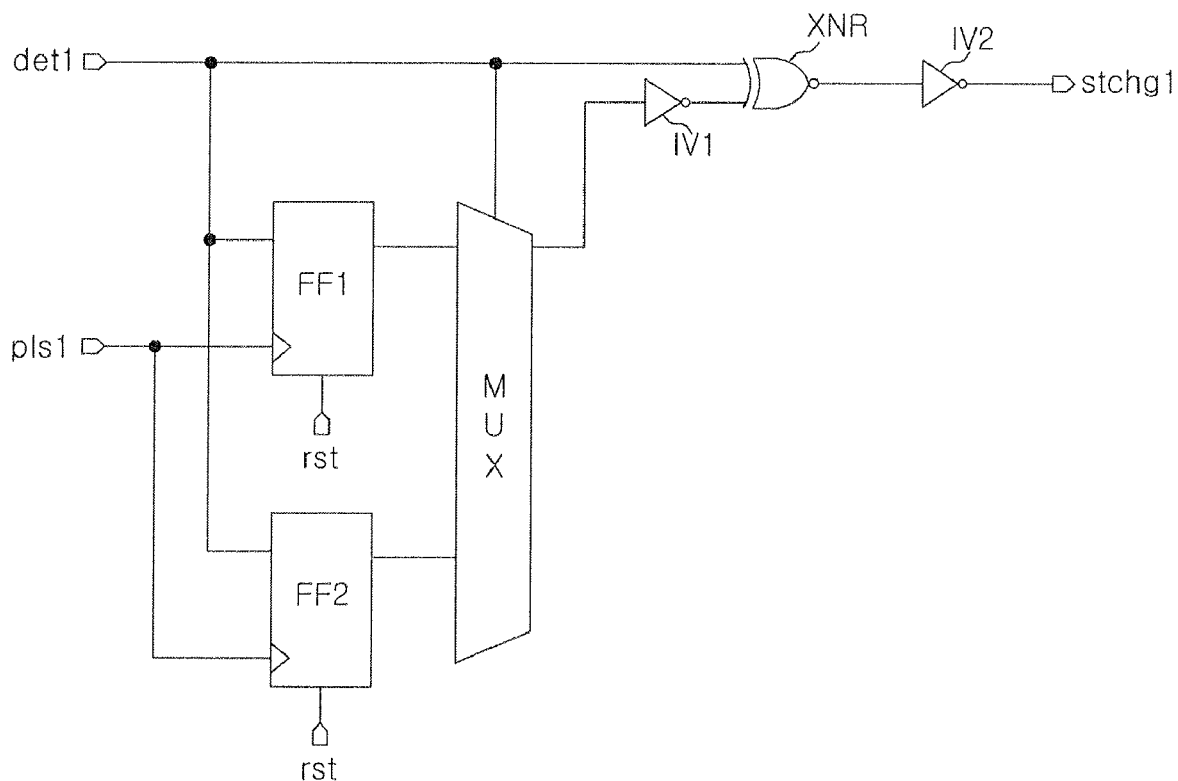
FIG. 4 is a detailed structural diagram showing an exemplary first state change determining section that can be included with the duty cycle control unit of FIG. 3 according to one embodiment of the present invention.

FIG. 4 is a detailed structural diagram showing an exemplary first state change determining section 510 that can be included with the duty cycle correcting unit 10 of FIG. 3 according to one embodiment of the present invention. For convenience, only the structure and operation of the first state change determining section 510 will be described in detail since the first state change determining section 510 and the second state change determining section 520 can have the same structure.

As shown in FIG. 4, the first state change determining section 510 can include a first flip-flop FF1, a second flip-flop FF2, a multiplexer MUX, a first inverter IV1, a second inverter IV2, and an exclusive NOR gate XNR.

The first flip-flop FF1 can latch the first detection signal 'det1' in response to the first pulse signal 'pls1'. The second flip-flop FF2 can also latch the first detection signal 'det1' in response to the first pulse signal 'pls1'. The multiplexer MUX can selectively output an output signal of the first flip-flop FF1 or an output signal of the second flip-flop FF2 in response to the first detection signal 'det1'. The first inverter IV1 can receive an output signal of the multiplexer MUX. The exclusive NOR gate XNR can receive the first detection signal 'det1' and an output signal of the first inverter IV1. The second inverter IV2 can receive an output signal of the exclusive NOR gate XNR and output the first state change signal 'stchg1'.

The first flip-flop FF1 can output a high-level signal when the first flip-flop FF1 is reset by a rest signal 'rst'. The second flip-flop FF2 can output a low-level signal when the second flip-flop FF2 is reset by the reset signal 'rst'. The multiplexer MUX can pass an output signal of the first flip-flop FF1 when the first detection signal 'det1' is disabled and pass an output signal of the second flip-flop FF2 when the first detection signal 'det1' is enabled.

According to the above structure of the first state change determining section 510, the multiplexer MUX can pass the output signal of the first flip-flop FF1 when the first detection signal 'det1' is initially disabled. Accordingly, the first state change signal 'stchg1' is disabled since low-level signals are input to the exclusive NOR gate XNR. The multiplexer MUX can pass the output signal of the second flip-flop FF2 when the first detection signal 'det1' is enabled. As a result, since high-level signals are input to the exclusive NOR gate XNR, the first state change signal 'stchg1' can be maintained in a disabled state. The second flip-flop FF2 can output a high-level signal when the first pulse signal 'pls1' is enabled and the exclusive NOR gate XNR can receive a high-level signal and a low-level signal. Accordingly, the first state change signal 'stchg1' is then enabled.

Meanwhile, when the first detection signal 'det1' is initially enabled, the multiplexer MUX can pass the output signal of the second flip-flop FF2. As a result, the first state change signal 'stchg1' is disabled since high-level signals are input to the exclusive NOR gate XNR. Accordingly, when the first detection signal 'det1' is disabled, the multiplexer MUX can pass the output signal of the first flip-flop FF1. As a result, the first state change signal 'stchg1' can be maintained in a disabled state since low-level signals are input to the exclusive NOR gate XNR. Whereas when the first pulse signal 'pls1' is enabled, the first flip-flop FF1 can output a low-level signal and the exclusive NOR gate XNR can receive a low-level signal and a high-level signal. Accordingly, the first state change signal 'stchg1' is enabled.

The first state change determining section 510 can be configured to determine whether the state of the first detection signal 'det1' changes and accordingly enable the first state change signal 'stchg1'. Although not shown, if the second state change determining section 520 is formed to have the same structure as the first state change determining section 510, the second state change determining section 520 can perform the same operation and determine whether the state of the second detection signal 'det2' changes and enabling the second state change signal 'stchg2' accordingly.

Figure 5:
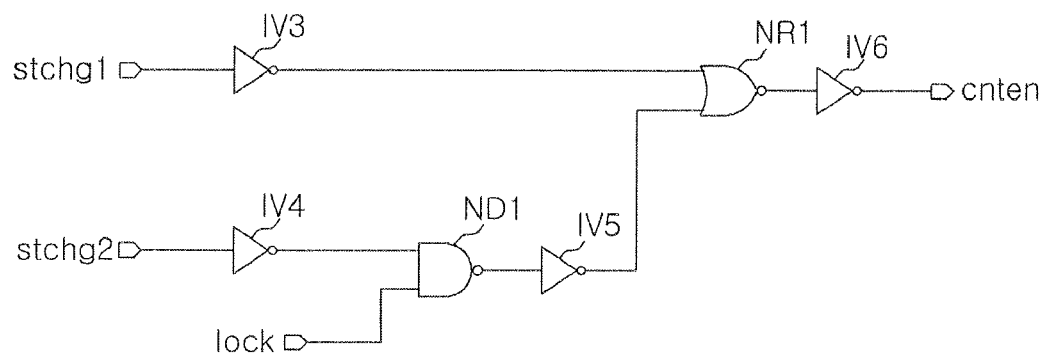
FIG. 5 is a detailed structural diagram showing an exemplary enable control section that can be included with the duty cycle control unit of FIG. 3 according to one embodiment of the present invention.

FIG. 5 is a detailed structural diagram showing an exemplary enable control section 530 that can be included with the duty cycle control unit of FIG. 3 according to one embodiment of the present invention.

As shown in FIG. 5, the enable control section 530 can include a third inverter IV3, a fourth inverter IV4, a fifth inverter IV5, a sixth inverter IV6, a first NAND gate ND1, and a first NOR gate NR1.

The third inverter IV3 can receive the first state change signal 'stchg1'. The fourth inverter IV4 can receive the second state change signal 'stchg2'. The first NAND gate ND1 can receive an output signal of the fourth inverter IV4 and the lock completion signal 'lock' of the operation mode setting unit 250. The fifth inverter IV5 can receive an output signal of the first NAND gate ND1. The first NOR gate NR1 can receive an output signal of the third inverter IV3 and an output signal of the fifth inverter IV5. The sixth inverter IV6 can receive an output signal of the first NOR gate NR1 and output the counting enable signal 'cnten'.

According to the above structure for the enable control section 530, when each of the first state change signal 'stchg1', the second state change signal 'stchg2', and the lock completion signal 'lock' are disabled at initial operation, the counting enable signal 'cnten' is enabled. Then, the counting enable signal 'cnten' is disabled when the first state change signal 'stchg1' is enabled.

The enable control section 530 enables the counting enable signal 'cnten' according to an enabled state of the second state change signal 'stchg2' when the delay locked operation of the feedback loop 20 is completed and the lock completion signal 'lock' is enabled. That is, when the second state change signal 'stchg2' is disabled, the enable control section 530 enables the counting enable signal 'cnten', and when the second state change signal 'stchg2' is enabled, the enable control section 530 enables the counting enable signal 'cnten'.

As such, the enable control section 530 enables the counting enable signal 'cnten' from when an initial operation is performed until the first state change signal 'stchg1' is enabled. In addition, the enable control section 530 enables the counting enable signal 'cnten' from when the lock completion signal 'lock' is enabled until the second state change signal 'stchg2' is enabled. That is, the counting enable signal 'cnten' can be set to enabled two times. Each enable interval can be an interval that defines a coarse correction operation or a fine correction operation.

Figure 6:
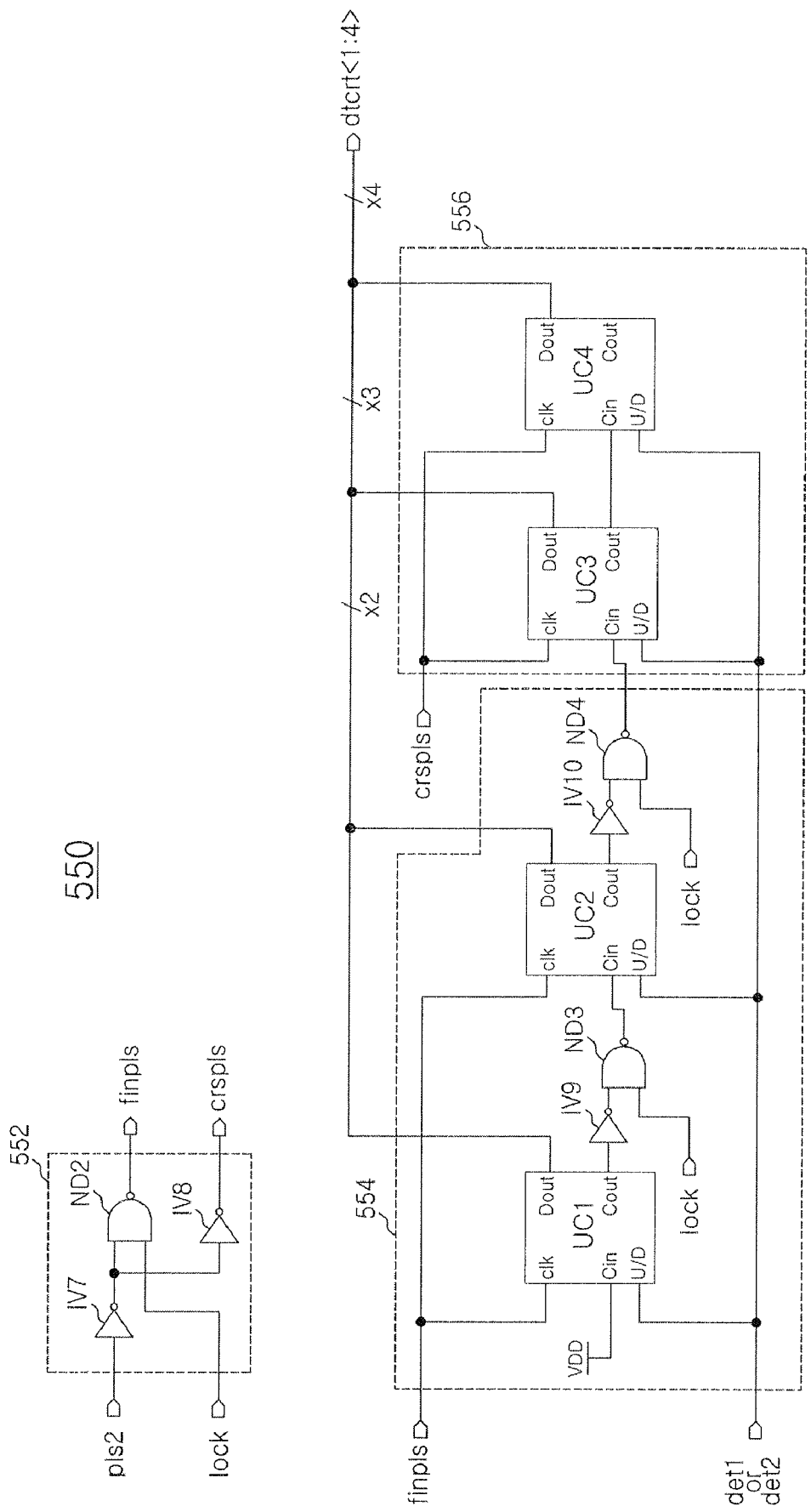
FIG. 6 is a detailed structural diagram showing an exemplary counting section that can be included with the duty cycle control unit of FIG. 3 according to one embodiment of the present invention.

FIG. 6 is a detailed structural diagram showing an exemplary counting section 550 that can be included with the duty cycle control unit of FIG. 3 according to one embodiment of the present invention.

As shown in FIG. 6, the counting section 550 can include a pulse signal control section 552, a fine counting section 554, and a coarse counting section 556.

The pulse signal control section 552 can generate a coarse pulse signal 'crspls' and a fine pulse signal 'finpls' from the second pulse signal 'pls2' in response to the lock completion signal 'lock' of the operation mode setting unit 250. The pulse signal control section 552 can include a seventh inverter IV7, an eighth inverter IV8, and a second NAND gate ND2.

The seventh inverter IV7 can receive the second pulse signal 'pls2'. The second NAND gate ND2 can receive an output signal of the seventh inverter IV7 and the lock completion signal 'lock' and output the fine pulse signal 'finpls'. The eighth inverter IV8 can receive an output signal of the seventh inverter IV7 and output the coarse pulse signal 'crspls'.

The fine counting section 554 can be activated in response to the fine pulse signal 'finpls' and the lock completion signal 'lock'. The fine counting section 554 can perform a counting operation in response to the first detection signal 'det1' or the second detection signal 'det2' transmitted from the switching section 540 and generate two lower bits 'dtcrt<3:4>' of the duty cycle correction signal. The fine counting section 554 can include a first unit cell UC1, a second unit cell UC2, a ninth inverter IV9, a tenth inverter IV10, a third NAND gate ND3, and a fourth NAND gate ND4.

Each of the first unit cell UC1 and the second unit cell UC2 can include a clock input terminal clk receiving the fine pulse signal 'finpls' and an up/down input terminal U/D receiving the first detection signal 'det1' or the second detection signal 'det2'. The first unit cell UC1 can include a carry input terminal Cin receiving the external voltage VDD. The ninth inverter IV9 can receive a signal from a carry output terminal Cout of the first unit cell UC1. The third NAND gate ND3 can receive an output signal of the ninth inverter IV9 and the lock completion signal 'lock', and transmit a generated output signal to the carry input terminal Cin of the second unit cell UC2. The tenth inverter IV10 can receive a signal from a carry output terminal Cout of the second unit cell UC2. The fourth NAND gate ND4 can receive an output signal of the tenth inverter IV10 and the lock completion signal 'lock', and transmit a generated output signal to the coarse counting section 556. A data output terminal Dout of the first unit cell UC1 can output the least significant bit 'dtcrt<4>' of the duty cycle correction signal, and a data output terminal Dout of the second unit cell UC2 can output a third bit 'dtcrt<3>' of the duty cycle correction signal.

The coarse counting section 556 can be activated in response to the coarse pulse signal 'crspls'. The coarse counting section 556 can perform a counting operation in response to an output signal as a carry transmitted from the fine counting section 554 and the first detection signal 'det1' or the second detection signal 'det2' transmitted from the switching section 540. The coarse counting section 556 can generate the two upper bits 'dtcrt<1:2>' of the duty cycle correction signal. The coarse counting section 556 can include a third unit cell UC3 and a fourth unit cell UC4.

The third unit cell UC3 includes a clock input terminal clk receiving the coarse pulse signal 'crspls' and an up/down input terminal U/D receiving the first detection signal 'det1' or the second detection signal 'det2'. The third unit cell UC3 includes a carry input terminal Cin receiving the carry transmitted from the fine counting section 554. A carry output from a carry output terminal Cout of the third unit cell UC3 can be transmitted to a carry input terminal Cin of the fourth unit cell UC4. A data output terminal Dout of the third unit cell UC3 can output a second bit 'dtcrt<2>' of the duty cycle correction signal. A data output terminal Dout of the fourth unit cell UC4 can output the most significant bit 'dtcrt<1>' of the duty cycle correction signal.

Where the lock completion signal 'lock' is disabled, the coarse pulse signal 'crspls' can be activated in response to the second pulse signal 'pls2', but the fine pulse signal 'finpls' cannot be activated. Therefore, the fine counting section 554 cannot be activated and the coarse counting section 556 can be activated. At this time, the fourth NAND gate ND4 of the fine counting section 554 outputs a high-level signal and the third unit cell UC3 of the coarse counting section 556 can perform a counting operation while using the high-level signal as an input carry of a default value.

However, when the lock completion signal 'lock' is enabled, the coarse pulse signal 'crspls' and the fine pulse signal 'finpls' can be activated. Accordingly, the fine counting section 554 and the coarse counting section 556 can be activated. At this time, an output carry of the first unit cell UC1 of the fine counting section 554 can be transmitted to a carry input terminal Cin of the second unit cell UC2. An output carry of the second unit cell UC2 can be transmitted to a carry input terminal Cin of the third unit cell UC3 of the coarse counting section 556. In this case, the fine counting section 554 and the coarse counting section 556 can perform a counting operation including the four unit cells and operate as a general counter circuit that generates four-bit signals. Each of the fine counting section 554 and the coarse counting section 556 can perform an up-counting operation when the first detection signal 'det1' or the second detection signal 'det2' is enabled and can perform a down-counting operation when the first detection signal 'det1' or the second detection signal 'det2' is disabled.

Figure 7:
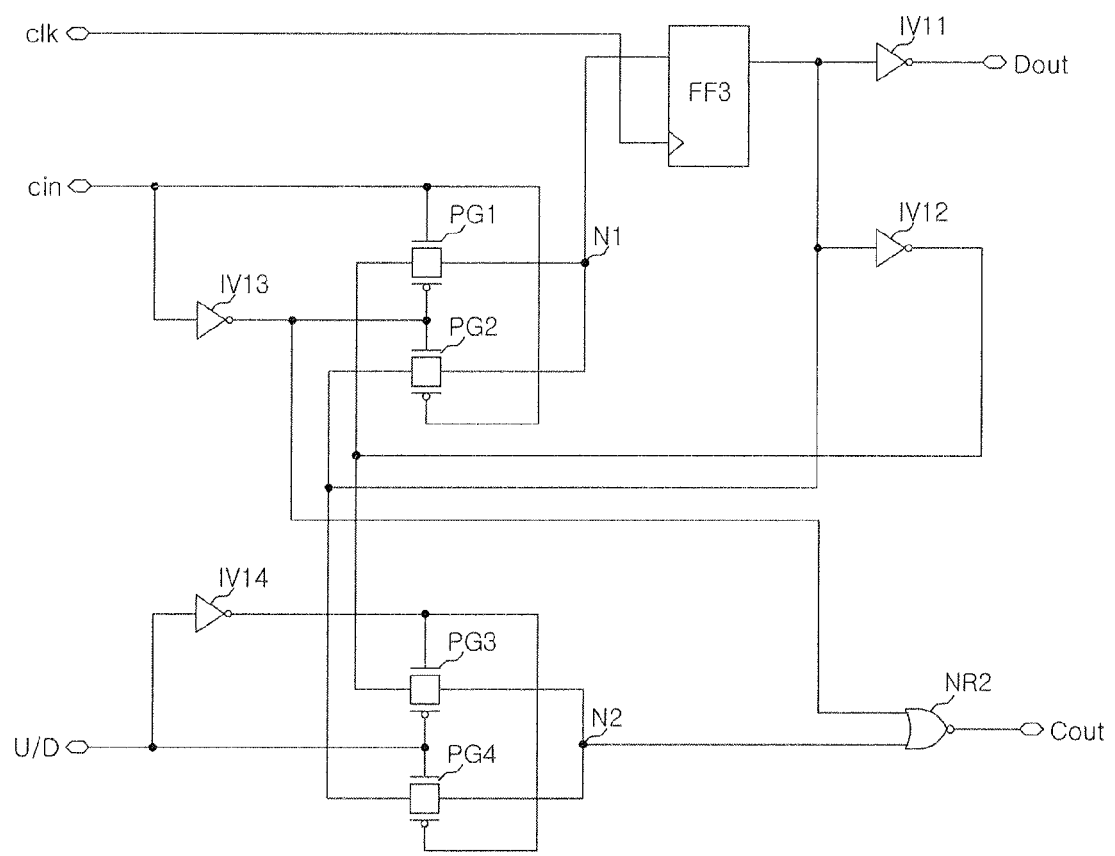
FIG. 7 is a detailed structural diagram showing an exemplary first unit cell UC1 that can be included with the circuit of FIG. 6 according to one embodiment of the present invention.

FIG. 7 is a detailed structural diagram showing an exemplary first unit cell UC1 that can be included with the circuit of FIG. 6 according to one embodiment of the present invention. Since each of the first through fourth unit cells UC1 to UC4 have the same structure, only the first unit cell UC1 will be described in detail.

As shown in FIG. 7, the first unit cell UC1 can include a third flip-flop FF3, an eleventh inverter IV11, a twelfth inverter IV12, a thirteenth inverter IV13, a fourteenth inverter IV14, a first pass gate PG1, a second pass gate PG2, a third pass gate PG3, a fourth pass gate PG4, and a second NOR gate NR2.

The third flip-flop FF3 can latch a voltage that is applied to a first node N1 in response to a signal input to the clock input terminal clk. The eleventh inverter IV11 can receive an output signal of the third flip-flop FF3 and output the output signal to the data output terminal Dout. The twelfth inverter IV12 can receive an output signal of the third flip-flop FF3.

The third inverter IV13 can receive a signal that is input to the carry input terminal Cin. The first pass gate PG1 can transmit an output signal of the twelfth inverter IV12 to the first node N1 in response to the signal input to the carry input terminal Cin and an output signal of the thirteenth inverter IV13. The second pass gate PG2 can transmit an output signal of the third flip-flop FF3 to the first node N1 in response to the signal input to the carry input terminal Cin and the output signal of the thirteenth inverter IV13.

The fourteenth inverter IV14 can receive a signal that is input to the up/down input terminal U/D. The third pass gate PG3 can transmit an output signal of the twelfth inverter IV12 to a second node N2 in response to the signal input to the up/down input terminal U/D and an output signal of the fourteenth inverter IV14. The fourth pass gate PG4 can transmit an output signal of the third flip-flop FF3 to the second node N2 in response to the signal input to the up/down input terminal U/D and the output signal of the fourteenth inverter IV14. The second NOR gate NR2 can receive an output signal of the thirteenth inverter IV13 and a voltage of the second node and output an output signal to the carry output terminal Cout.

As described above, in the DLL circuit according to one embodiment of the present invention, even though the input reference clock signal may have a distorted waveform, a duty cycle correction operation on the reference clock signal can be primarily performed. Thus, the removal of the reference clock signal on the delay line can be prevented, i.e., an erroneous operation can be prevented. In addition, it is possible to perform an elaborate duty cycle correction operation since the duty cycle of the output clock signal is secondarily corrected after the delay lock operation is completed.

At this time, an internal clock signal can be stably generated without deteriorating the operational efficiency of the DLL circuit since the primary duty cycle correction operation is implemented using the coarse correction operation and the secondary duty cycle correction operation is implemented using the fine correction operation.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A delay locked loop (DLL) circuit, comprising:
   a duty cycle correcting unit configured to correct a duty cycle of a reference clock signal in response to a duty cycle correction signal and generate a correction clock signal;
   a feedback loop configured to perform a delay lock operation on the correction clock signal and generate an output clock signal;
   a first duty cycle detecting unit configured to detect a duty cycle of the correction clock signal and generate a first detection signal;
   a second duty cycle detecting unit configured to detect a duty cycle of the output clock signal and generate a second detection signal; and
   a duty cycle control unit configured to generate the duty cycle correction signal in response to the first detection signal and the second detection signal.

2. The DLL circuit of claim 1, wherein the feedback loop is configured to perform the delay lock operation when an operation enable signal is enabled and enable a lock completion signal when the delay lock operation is completed.

3. The DLL circuit of claim 2, wherein the feedback loop includes:
   a delay line configured to delay the correction clock signal in response to a delay control signal and generate a delay clock signal;
   a clock driver configured to drive the delay clock signal and generate the output clock signal;
   a delay compensating unit configured to apply a delay time to the delay clock signal and generate a feedback clock signal, wherein the delay time is obtained by simulating a delay amount on an output path of the delay clock signal;
   a phase detecting unit configured to compare phases of the correction clock signal and the feedback clock signal and generate a phase detection signal;
   an operation mode setting unit configured to determine whether the delay lock operation is completed in response to the phase detection signal and generate the lock completion signal; and
   a delay control unit configured to generate the delay control signal in response to the operation enable signal, the phase detection signal, and the lock completion signal.

4. The DLL circuit of claim 1, wherein the first duty cycle detecting unit is configured to enable the first detection signal when a first interval of the correction clock signal is wider than a second interval of the correction clock signal and disable the first detection signal when the first interval of the correction clock signal is narrower than the second interval of the correction clock signal.

5. The DLL circuit of claim 1, wherein the second duty cycle detecting unit is configured to enable the second detection signal when a first interval of the output clock signal is wider than a second interval of the output clock signal and disable the second detection signal when the first interval of the output clock signal is narrower than the second interval of the output clock signal.

6. The DLL circuit of claim 2, wherein the duty cycle control unit is configured to control a primary correction operation until a state of the first detection signal changes from a state occurring at an initial operation, enable the operation enable signal when the primary correction operation is completed, and perform a secondary correction operation until a state of the second detection signal changes from a state of the second detection signal at a time when the lock completion signal is enabled.

7. The DLL circuit of claim 6, wherein the duty cycle control unit is configured to change a logical value of the duty cycle correction signal to adjust the duty cycle of the reference clock by a relatively large unit amount during the primary correction operation as compared with the secondary correction operation.

8. The DLL circuit of claim 7,
   wherein the duty cycle control unit includes:
   a first state change determining section configured to determine whether the state of the first detection signal changes in response to a first pulse signal and generate a first state change signal;
   a second state change determining section configured to determine whether the state of the second detection signal changes in response to the first pulse signal and generate a second state change signal;
   an enable control section configured to combine the first state change signal, the second state change signal, and the lock completion signal and generate a counting enable signal;
   a switching section configured to selectively pass the first detection signal or the second detection signal in response to the lock completion signal; and
   a counting section configured to perform a counting operation in response to a second pulse signal, the lock completion signal, and the first detection signal or the second detection signal transmitted from the switching section according to the counting enable signal and generate the duty cycle correction signal, and wherein the first state change signal is output as the operation enable signal.

9. The DLL circuit of claim 8, wherein the enable control section is configured to enable the counting enable signal during a period from when an initial operation starts to when the state of the first detection signal changes and a period from when the lock completion signal is enabled to when the state of the second detection signal changes.

10. The DLL circuit of claim 8, wherein the counting section is configured to perform an up-counting operation or a down-counting operation according to whether the first detection signal or the second detection signal transmitted from the switching section is enabled, and wherein the counting section only performs a counting operation on predetermined upper bits of the duty cycle correction signal during the primary correction operation.

11. The DLL circuit of claim 10, wherein the counting section includes:
    a pulse signal control section configured to generate a coarse pulse signal and a fine pulse signal from the second pulse signal in response to the lock completion signal;
    a fine counting section configured to activate in response to the fine pulse signal and the lock completion signal, and perform a counting operation in response to the first detection signal or the second detection signal transmitted from the switching section to generate predetermined lower bits of the duty cycle correction signal; and
    a coarse counting section configured to activate in response to the coarse pulse signal, and perform a counting operation in response to a carry transmitted from the fine counting section and the first detection signal or the second detection signal transmitted from the switching section to generate the predetermined upper bits of the duty cycle correction signal.

12. A delay locked loop (DLL) circuit, comprising:
    a duty cycle correcting unit configured to correct a duty cycle of a reference clock signal in response to a duty cycle correction signal and generate a correction clock signal;
    a duty cycle control unit configured to primarily adjust a logical value of the duty cycle correction signal before a delay lock operation is completed and secondarily adjust the logical value of the duty cycle correction signal after the delay lock operation is completed; and
    a delay line configured to delay the correction clock signal.

13. The DLL circuit of claim 12,
    wherein the duty cycle correction signal is configured as a plurality of bits of a digital code, and
    the duty cycle correcting unit is configured to change the correction amount of the duty cycle of the reference clock signal according to the logical value of the duty cycle correction signal.

14. The DLL circuit of claim 13, wherein the duty cycle correcting unit includes:
    a first driver configured to drive the reference clock signal in response to an inverted duty cycle correction signal and output a driving clock signal; and
    a second driver configured to drive the driving clock signal in response to the duty cycle correction signal and generate the correction clock signal.

15. The DLL circuit of claim 14, wherein the first driver includes:
    an output node configured to output the driving clock signal;
    a default driver configured to drive the reference clock signal and transmit the driven reference clock signal to the output node;
    a pull-up unit configured to drive a voltage of the output node using a pull-up method in response to the reference clock signal and the inverted duty cycle correction signal; and
    a pull-down unit configured to drive a voltage of the output node using a pull-down method in response to an external voltage and the reference clock signal.

16. The DLL circuit of claim 15,
    wherein the pull-up unit includes a plurality of transistors each receiving one bit of the inverted duty cycle correction signal, respectively, and
    wherein a transistor among the plurality of transistors that receives an upper bit of the inverted duty cycle correction signal is configured to have a larger size than the remaining plurality of transistors.

17. The DLL circuit of claim 14, wherein the second driver includes:
    an output node configured to output the correction clock signal;
    a default driver configured to drive the driving clock signal and transmit the driven driving clock signal to the output node;
    a pull-up unit configured to drive a voltage of the output node using a pull-up method in response to the driving clock signal and a ground voltage; and
    a pull-down unit configured to drive a voltage of the output node using a pull-down method in response to the duty cycle correction signal and the driving clock signal.

18. The DLL circuit of claim 17,
    wherein the pull-down unit includes a plurality of transistors each receiving one bit of the duty cycle correction signal, respectively, and
    wherein a transistor among the plurality of transistors that receives an upper bit of the duty cycle correction signal is configured to have a larger size than the remaining plurality of transistors.

19. The DLL circuit of claim 12, further comprising:
    a first duty cycle detecting unit configured to detect a duty cycle of the correction clock signal and generate a first detection signal; and
    a second duty cycle detecting unit configured to detect a duty cycle of a final output clock signal of the DLL circuit and generate a second detection signal.

20. The DLL circuit of claim 19, wherein the duty cycle control unit is configured to control a coarse correction operation that changes the logical value of the duty cycle correction signal to adjust the duty cycle of the reference clock by a relatively large unit amount during the primary adjustment of the logical value of the duty cycle correction signal as compared with the secondary adjustment of the logical value of the duty cycle correction signal that implements a fine correction operation.

21. The DLL circuit of claim 20, wherein the duty cycle control unit is configured to determine whether the coarse correction operation is completed according to a state change of the first detection signal and determine whether the fine correction operation is completed according to a state change of the second detection signal.

22. The DLL circuit of claim 21, wherein the duty cycle control unit includes:
    a first state change determining section configured to determine whether the state of the first detection signal changes in response to a first pulse signal and generate a first state change signal;

a second state change determining section configured to determine whether the state of the second detection signal changes in response to the first pulse signal and generate a second state change signal;

an enable control section configured to combine the first state change signal, the second state change signal, and a lock completion signal and generate a counting enable signal;

a switching section configured to selectively pass the first detection signal or the second detection signal in response to the lock completion signal; and a counting section configured to perform a counting operation in response to a second pulse signal, the lock completion signal, and the first detection signal or the second detection signal transmitted from the switching section according to the counting enable signal and generate the duty cycle correction signal.

23. The DLL circuit of claim 22, wherein the enable control section is configured to enable the counting enable signal during a period from when an initial operation starts to when the state of the first detection signal changes and a period from when the lock completion signal is enabled to when the state of the second detection signal changes.

24. The DLL circuit of claim 22, wherein the counting section is configured to perform an up-counting operation or a down-counting operation according to whether the first detection signal or the second detection signal transmitted from the switching section is enabled, and wherein the counting section only performs a counting operation on predetermined upper bits of the duty cycle correction signal during the primary correction operation.

25. The DLL circuit of claim 24, wherein the counting section includes:

a pulse signal control section configured to generate a coarse pulse signal and a fine pulse signal from the second pulse signal in response to the lock completion signal;

a fine counting section configured to activate in response to the fine pulse signal and the lock completion signal, and perform a counting operation in response to the first detection signal or the second detection signal transmitted from the switching section to generate predetermined lower bits of the duty cycle correction signal; and a coarse counting section configured to activate in response to the coarse pulse signal, and perform a counting operation in response to a carry transmitted from the fine counting section and the first detection signal or the second detection signal transmitted from the switching section to generate the predetermined upper bits of the duty cycle correction signal.

26. The DLL circuit of claim 22, further comprising:

a phase detecting unit configured to compare phases of the correction clock signal and a feedback clock signal and generate a phase detection signal;

an operation mode setting unit configured to determine whether the delay lock operation is completed in response to the phase detection signal and generate the lock completion signal; and a delay control unit configured to control a delay amount of the delay line in response to the phase detection signal when the coarse correction operation is completed.

27. A method of controlling a delay locked loop (DLL) circuit, comprising:

performing a primary duty cycle correction operation on a reference clock signal to generate a correction clock signal;

performing a delay lock operation on the correction clock signal to generate an output clock signal; and performing a secondary duty cycle correction operation on the output clock signal after the delay lock operation is completed.

28. The method of claim 27, wherein the performing of the primary duty cycle correction operation includes:

detecting a duty cycle of the correction clock signal to generate a first detection signal;

performing an up/down counting operation in response to the first detection signal to generate a plurality of bits for a duty cycle correction signal, wherein a counting operation is only performed on predetermined upper bits of the duty cycle correction signal; and changing a correction amount of a duty cycle of the reference clock signal according to a logical value of the duty cycle correction signal.

29. The method of claim 28, wherein the performing of the delay lock operation includes:

enabling an operation enable signal in response to a state change of the first detection signal;

controlling a delay amount applied to the correction clock signal using a delay line according to a compared result of phases of the correction clock signal and a feedback clock signal, in response to the operation enable signal;

driving a delay clock signal output from the delay line to generate the output clock signal; and determining whether the delay lock operation is completed according to the compared result of the phases of the correction clock signal and the feedback clock signal.

30. The method of claim 29, wherein the performing of the secondary duty cycle correction operation includes:

detecting a duty cycle of the output clock signal to generate a second detection signal;

performing an up/down counting operation in response to the second detection signal to generate a plurality of bits for the duty cycle correction signal, wherein a counting operation is performed on all bits of the duty cycle correction signal; and changing the correction amount of the duty cycle of the reference clock signal according to the logical value of the duty cycle correction signal.

* * * * *